(12) United States Patent
Åström et al.

(10) Patent No.: US 6,185,116 B1
(45) Date of Patent: Feb. 6, 2001

(54) HVDC POWER TRANSMISSION SYSTEM WITH COOLING AND SWITCHING DEVICE TEMPERATURE DETECTION

(75) Inventors: Urban Åström, Saxdalen; Krister Nyberg, Smedjebacken; Roland Siljeström, Grängesberg; Gunnar Asplund; Hans Björklund, both of Ludvika, all of (SE)

(73) Assignee: ABB AB, Vasteras (SE)

( * ) Notice: Under 35 U.S.C. 154(b), the term of this patent shall be extended for 0 days.

(21) Appl. No.: 09/445,551

(22) PCT Filed: Jun. 9, 1998

(86) PCT No.: PCT/SE98/01100

§ 371 Date: Dec. 9, 1999

§ 102(e) Date: Dec. 9, 1999

(87) PCT Pub. No.: WO98/57407

PCT Pub. Date: Dec. 17, 1998

(30) Foreign Application Priority Data

Jun. 11, 1997 (SE) .................................................. 9702223

(51) Int. Cl.[7] ...................................................... H02J 3/36
(52) U.S. Cl. .............................. 363/51; 363/35; 363/141; 361/676

(58) Field of Search .............................. 363/35, 51, 141; 361/676, 677

(56) References Cited

U.S. PATENT DOCUMENTS

| 4,142,230 | * | 2/1979 | Menju et al. | 363/51 |
| 4,475,152 | * | 10/1984 | Ikegame et al. | 363/141 |
| 4,816,983 | * | 3/1989 | Yoshizumi et al. | 363/141 |
| 5,953,224 | * | 9/1999 | Gold et al. | 363/141 |

* cited by examiner

Primary Examiner—Jeffrey Sterrett
(74) Attorney, Agent, or Firm—Dykema Gossett PLLC

(57) ABSTRACT

A device for supervising the cooling of a cooling system of a valve of a high voltage converter station located on high voltage potential level comprises members (31) located on high voltage potential level and adapted to detect the temperature at cooling blocks (32) of the valve on high voltage potential level and send values so detected to first control units (3) for controlling semiconductor components (4) of the valve. The first control units have means (20) for treating said values detected and the first control units are adapted to send data resulting from said treatment to an arrangement (16) for supervising said valve located on low potential level.

2 Claims, 2 Drawing Sheets

HVDC POWER TRANSMISSION SYSTEM WITH COOLING AND SWITCHING DEVICE TEMPERATURE DETECTION

FIELD OF THE INVENTION AND PRIOR ART

The present invention relates to a device for supervising the cooling of a cooling system of a valve of a high voltage converter station located on high voltage potential level and having a plurality of valve units each having at least one semiconductor component of turn-on-type and for each semiconductor component a first control unit located on high voltage potential level and controlling said component, said first control units being connected to a valve control unit located on low potential level for communication between the valve control unit and the first control units, and said valve having an arrangement for cooling said semiconductor components with a cooling block associated with the respective semiconductor component and adapted to absorb heat from the semiconductor component and transfer it to a cooling medium.

Such high voltage converter stations may for example be stations in plants for transmitting electric power through High Voltage Direct Current (HVDC) for converting direct voltage into alternating voltage and conversely, but the invention is not restricted thereto, but is directed to supervising all types of high voltage converter stations, in which high voltage here typically may be voltages within the range 10–500 kV. Each valve unit has usually a plurality of semiconductor components of turn-on-type connected in series, such as thyristors, IGBTs or the like, which are controlled simultaneously, so that they act as one single switch, and among which the voltage to be held by the valve unit in a turned-off-state of said semiconductor components is distributed, since they normally only can hold 1–10 kV each.

Since high powers are handled by such a high voltage converter station and by that a drop out of parts thereof or the entire station during a certain period of time generates high costs, it is an important desire to be able to supervise different positions of said valve so as to be able to take necessary measures upon deviations from the normal state thereof for avoiding operation interruptions not planned as far as possible and minimise the closing times for maintenance by receiving information about exactly which components have a defect. Information about components starting to get deviating properties without being defect for that sake is also of interest, since correcting measures may be planned timely.

However, the different said positions are located on high voltage potential level, which makes the supervision thereof difficult, so that the way of proceeding has until now with respect to most of the positions been restricted to carrying out a measurement of a parameter associated with the position in question on ground potential level so as to then calculate a probable value of the parameter on high voltage potential level. The cooling of a said cooling system has been supervised by determining the temperature of the cooling water passing the semiconductor components for cooling thereof, in which this temperature has been determined indirectly by measuring the temperature of a cooling loop of the cooling system located on ground potential level so as to calculate the temperature of the cooling water in the valve in question therefrom. It is natural that the accuracy will not be an optimum and that there are sources of faults making it possible to obtain values not at all corresponding to the reality. Furthermore, the determination is very inaccurate, since for example a very increased temperature of a single semiconductor component may not be determined, since this high temperature will have a minor influence upon the temperature of the cooling liquid in said loop on ground potential level.

SUMMARY OF THE INVENTION

The object of the present invention is to provide a device of the type defined in the introduction, which improves the possibilities to supervise the cooling of said cooling system considerably and by that be able to check the state of such a valve and by that avoid unnecessary breakdowns of components and unplanned operation interruptions.

This object is according to the invention obtained by providing a device of the type defined in the introduction which comprises temperature detecting members arranged at at least some of said cooling blocks and adapted to send values detected thereby to the first control unit associated with the respective semiconductor component for elaborating and transmitting data with respect to the temperature of said cooling block to an arrangement for supervising the valve located on low potential level. By measuring the temperature at said different cooling blocks on high voltage potential level and directly close to the semiconductor components it will be possible to arrive to conclusions with respect to the temperature of the semiconductor components with a high reliability, which enables an elimination of a part of the protection systems for supervising cooling medium of high voltage converter stations already known or improving the accuracy thereof.

According to a preferred embodiment of the invention said temperature detecting members are arranged in each cooling block for detecting the temperature at each said semiconductor component of the valve. A temperature increase locally in any of the semiconductor components may by this efficiently be detected with a short delay, so that measures required, such as for example refiring of a semiconductor component not turned on or the like, may be carried out so as to reduce the power dissipation in the semiconductor component in question, disconnecting thereof or other measures may be taken before an overcurrent protection present will be activated. The state in the region of each individual semiconductor component of the valve may by this be efficiently supervised, so that possible deviations from the desired values of the temperature may be discovered early and suitable measures may rapidly be taken for minimising the number of drop-outs of the components, operation interruptions and the like. Thus, a fault or defect of a quite particular semiconductor component is here discovered in place, i.e. on high voltage potential level, without the problem that such information about such a fault is smeared out by the good function of a number of other such semiconductor components or by the distance between the high voltage potential level and the low potential level.

According to another preferred embodiment of the invention, which is applicable to a high voltage converter station in which the first control units are connected with a valve control unit located on low potential level through light conductors for communication between the valve control unit and the first control units while separating them galvanically, the first control units have means for treating said values detected, and that first control units are adapted to utilise light conductors running back therefrom to the valve control unit for sending information resulting from said treatment to said arrangement for supervising said valve.

No additional arrangements for bringing the values in question down to "the ground" are by this required, since the light conductors already there are used for this purpose while obtaining the galvanic separation required between high voltage potential level and low potential level. It is only required that said first control units are supplemented by said means and that the different measuring members are applied in suitable places and connected to the first control unit, which may be achieved by conductors of electricity.

Further advantages as well as advantageous features of the invention appear from the following description and the other dependent claims.

BRIEF DESCRIPTION OF THE DRAWING

With reference to the appended drawing, below follows a description of a preferred embodiment of the invention cited as an example.

In the drawing.

DETAILED DESCRIPTION OF A PREFERRED EMBODIMENT OF THE INVENTION

Figure 1:
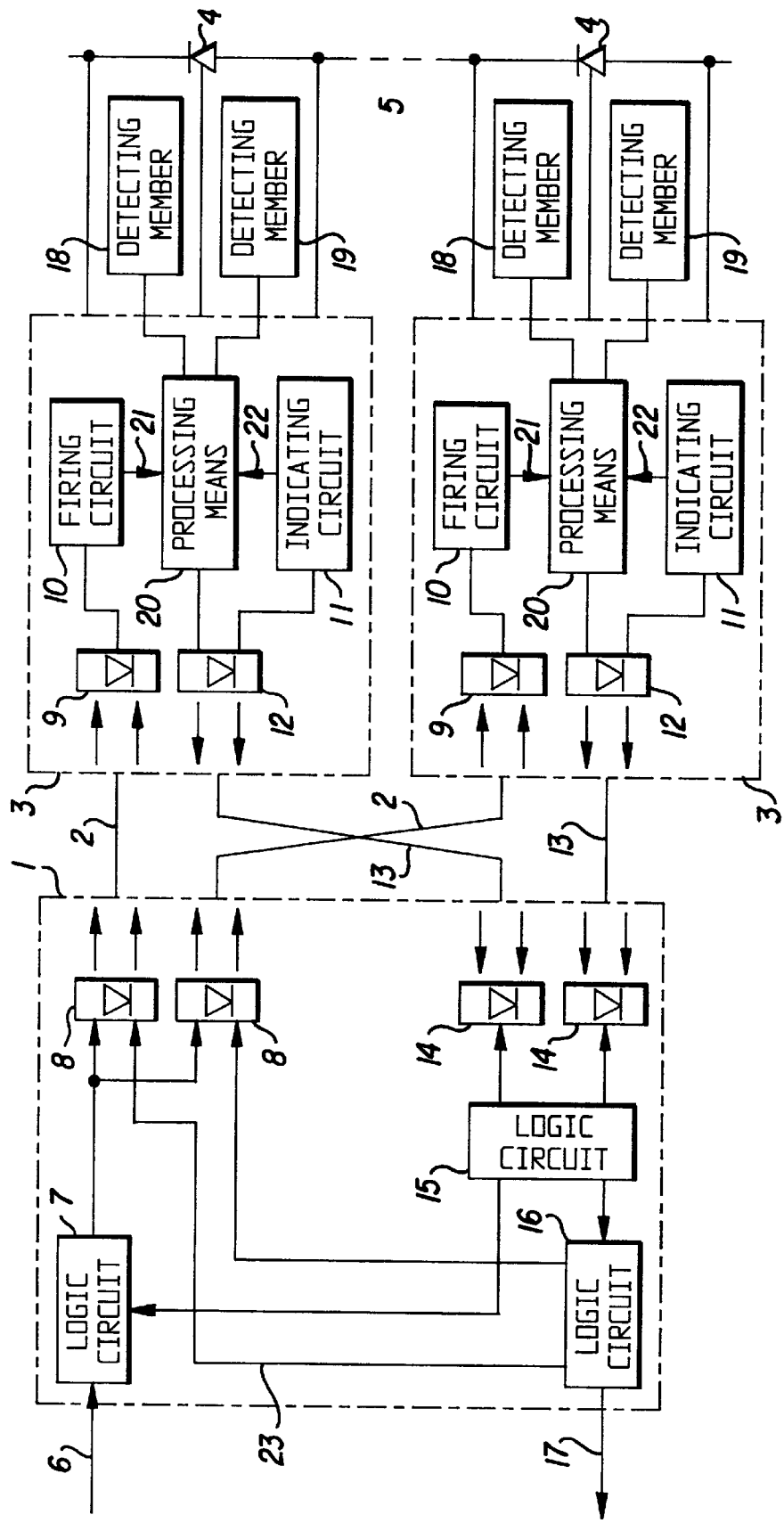
FIG. 1 is a simplified diagram illustrating the principle of the function of a device according to a preferred embodiment of the invention.

The general construction of a valve of a high voltage converter station, for example for converting High Voltage Direct Current (HVDC) into alternating current and conversely, and a valve control unit associated therewith, are schematically illustrated in FIG. 1, as well as schematically how the invention may be realised. A valve control unit 1 is in the converter station adapted to communicate through light conductors 2, i.e. opto-cables, with control units 3 for controlling semiconductor components 4 of turn-on-type belonging to the valve units, such as thyristors, in which the control then only relates to turn-on, and IGBTs, in which the control then also comprises turn-off. A greater number of such semiconductor components are usually connected in series within one single valve unit and intended to be controlled simultaneously through a control unit 3 each, which is indicated through the dashed line at 5. A valve consists in its turn of a plurality of such valve units. We will for the sake of simplicity in the description now following assume that the semiconductor components consist of thyristors which may not be turned off, although the invention is not in any way restricted thereto.

The valve control unit 1 is located on low voltage potential level, i.e. on earth, and it receives in a conventional way a control pulse through an input 6 to a logic circuit 7 for normal turning-on or firing, which sends a turn-on or firing signal further to different light emitting diodes 8 so as to make the light conductors to send firing signals to all the thyristor control units 3 belonging to the valve unit. The thyristor control units have light emitting diodes 9 adapted to receive the firing signals and through a firing circuit 10 act upon the gate of the thyristor 4 for taking care of a turning-on of the thyristor. The thyristor control unit has in a conventional way also a circuit 11 for sending an indication pulse to light emitting diodes 12 and further through light conductors 13 to photo diodes 14 of the valve control unit so as to indicate that the voltage across the thyristor in question in the forward bias direction thereof is sufficient for making a turn-on possible to take place rapidly and efficiently with low power losses during the firing step.

The indication pulses go further through a logic circuit 15, the function of which will be explained further below, to the circuit 7 so as to control the sending of a firing pulse thereby. The valve control unit 1 has also a logic circuit 16 for supervising the different positions of the valve for sending them from the valve control unit through a supervising bus 17.

Except from the particular arrangement of the circuits 15 and 16 the features described above are part of the prior art. The characterising features of the invention will now be described.

The supervising device comprises members 18, 19 schematically indicated adapted to detect function parameters of the valve on high voltage potential level and send values detected thereby to the thyristor control units 3. Such members are here arranged in the vicinity of each of the thyristors. Furthermore, the device has means 20 belonging to the thyristor control unit adapted to process the values detected by the members 18 and 19. Said means 20 are connected to the light emitting diodes so as to send information resulting from said processing through the light conductors 13. This means 20 is constituted by a micro computer with a low consumption of power, which receives measurement values from the members 18 and 19 and after processing thereof sends codes out on the light conductors 13. The sending of this information is then preferably synchronised with the sending of firing and/or indication pulses, which is indicated by the arrows 21, 22. The signals coming from the light conductors 13 to the valve control unit are filtrated in the logic circuit 15 for indication pulses, so that the indication pulses are sent on to the circuit 7 while the data emanating from the means 20 are sent further to the supervising arrangement 16 for a suitable treatment therein.

The supervising arrangement has also an output 23 connected to the light conductors 2 through the light emitting diodes 8 for sending messages to the thyristor control units 3, such as for example additional firing pulses so as to check the function of the different thyristors.

Figure 2:
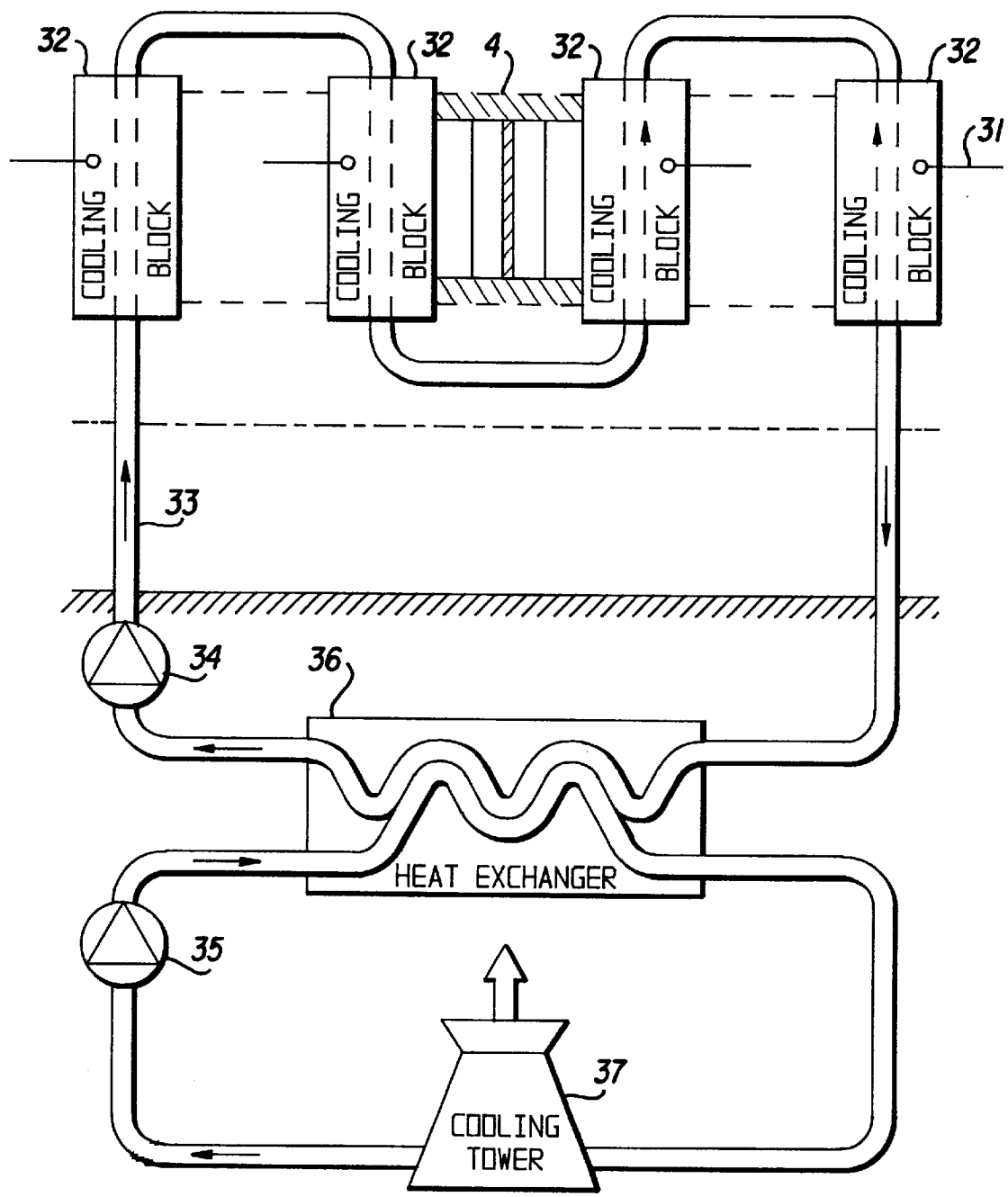
FIG. 2 is a diagram illustrating how the cooling of the semiconductor components of a valve may take place and how the temperature of the cooler may be determined according to the invention.

A device according to a preferred embodiment of the invention is schematically illustrated in FIG. 2, in which members 31 schematically indicated are adapted to detect the temperature of the respective cooling blocks 32, which are normally made of aluminium and surround the semiconductor component 4 in question for cooling thereof through a cooling medium, usually water, circulating through the cooling block through conduits 33. The cooling blocks and the cooling conduit 33 are parts of a cooling arrangement, which is constructed in a conventional way and includes pumps 34, 35, heat exchangers 36 and a cooling tower 37 cooled by air. Said members 31 are adapted to send values detected thereby to the first control unit 3 associated with the respective semiconductor component for elaborating an transmitting data concerning the temperature of said cooling block to said supervising arrangement. The supervising arrangement may by this receive reliable data concerning the cooling temperature at the respective semiconductor component, so that a temperature increase thereof may be rapidly discovered and suitable measures be taken.

The invention is of course not in any way restricted to the preferred embodiments described above, but many possibilities to modifications thereof would be apparent to a man skilled in the art without departing from the basic idea of the invention as defined in the claims.

Although it is advantageous to utilise light conductors present for the firing function for transmitting information from high potential level to low potential level this may also take place through said separate conductors.

What is claimed is:

1. A device for supervising the cooling of a cooling system of a valve of a high voltage converter station located on high voltage potential level and having a plurality of valve units each having at least one semiconductor component of turn-on-type and for each semiconductor component a first control unit located on high voltage potential level and controlling said component, said first control units being connected to a valve control unit located on low potential level for communication between the valve control unit and the first control units, and said device comprising temperature detecting members adapted to send values detected thereby to the first control unit associated with the respective semiconductor component for elaborating and transmitting data with respect to the temperature of the semiconductor component to an arrangement for supervising the valve located on low potential level wherein said valve has an arrangement for cooling said semiconductor components with a cooling block associated with the respective semiconductor component and adapted to absorb heat from the semiconductor component and transfer it to a cooling medium, and said temperature detecting members being arranged in each cooling block for detecting the temperature at each said semiconductor component of the valve.

2. A device according to claim 1, said first control units being connected to a valve control unit located on low potential level through light conductors for communication between the valve control unit and the first control units while separating them galvanically, wherein the first control units have means for treating said values detected, and that first control units being adapted to utilize light conductors running back therefrom to the valve control unit for sending information resulting from said treatment to said arrangement for supervising said valve.

* * * * *